March 27, 1962 W. GLUCK 3,027,004

PIN-RECEIVING CONTACTS FOR PRINTED CIRCUIT BOARD

Filed Aug. 13, 1957

INVENTOR.
WILLIAM GLUCK
BY James and Franklin
ATTORNEYS

United States Patent Office 3,027,004

Patented Mar. 27, 1962

3,027,004
PIN-RECEIVING CONTACTS FOR PRINTED CIRCUIT BOARD

William Gluck, Yonkers, N.Y., assignor to Industrial Electronic Hardware Corp., a corporation of New York Filed Aug. 13, 1957, Ser. No. 677,857
12 Claims. (Cl. 206—56)

This invention relates to printed circuit boards, and more particularly to contacts for receiving the pins of detachable components, particularly vacuum tubes.

Detachable components, particularly vacuum tubes, are usually received in a socket. The socket comprises an insulation base carrying metal contacts each having a pin grip portion and a soldering lug. With the development of printed circuitry, the soldering lugs have been replaced by support posts received in mating holes in the printed circuit board, and the electrical connection is usually accomplished by dipping or pot soldering. Such sockets are elevated a substantial distance above the printed circuit board.

It has already been suggested to apply the metal contacts of the socket directly to the printed circuit board, thus eliminating the insulation base, but a radio and television set manufacturer does not want the task of handling small individual metal contacts. He does not want to become a socket manufacturer. Moreover, the latter has automatic machines for assembling the contacts and base, but the set manufacturer faces the difficulty that different sizes of socket are used in different positions and orientation on the printed circuit board. Moreover, suggested contacts for this purpose have not proved satisfactory. Some suffer from the difficulty that if pot soldering is attempted, the solder reaches the pin grip portion, thus spoiling it for its intended purpose.

The primary object of the present invention is to overcome the foregoing difficulties, and to provide contacts which may be conveniently assembled with a printed circuit board with much the same ease and convenience as though using assembled sockets. More specific objects are to provide contacts which do not require an insulation base; which employ less metal; which result in a compact space-saving assembly of vacuum tube and printed circuit board; and which are adapted for pot soldering.

To accomplish the foregoing general objects, and other more specific objects which will hereinafter appear, my invention resides in the pin-receiving contacts, and a step product comprising a pre-arranged array of such contacts temporarily held in proper position for simultaneous insertion in a printed circuit board, and their relation one to another as are hereinafter more particularly described in the following specification. The specification is accompanied by a drawing in which.

Figure 1:
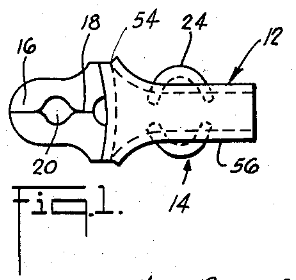
FIG. 1 is a plan view of a contact embodying features of my invention.
Figure 3:
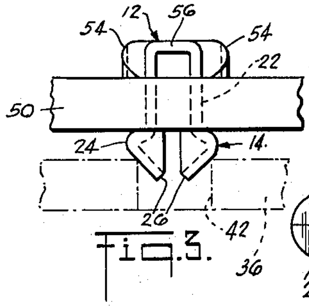
FIG. 3 is an end elevation of the same.
Figure 2:
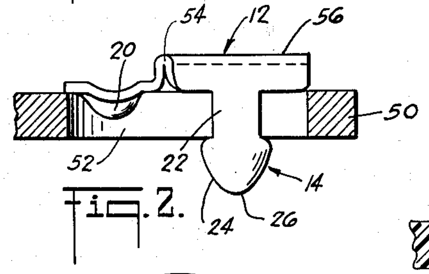
FIG. 2 is a front elevation of the same, temporarily mounted in a slotted cardboard holder.

Referring to the drawing, and more particularly to FIGS. 1, 2 and 3, the metal contact comprises a single piece of sheet metal shaped and formed to provide an elongated top 12, and a split resilient snap button 14 depending from the top near one end thereof. The top is longitudinally split at 16, 18 to form a pin grip 20 near the other end thereof.

The button 14 comprises a neck portion 22 and an enlarged head 24. The head is somewhat pointed, as shown at 26, to facilitate insertion through a mating hole in a printed circuit board. The term "pointed" is here used in a broad sense, and includes a bluntly rounded head, or a bullet-shaped head, somewhat as shown in the drawing.

Figure 4:
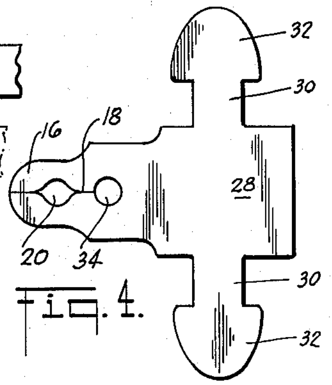
FIG. 4 shows the shape of a metal blank from which the said contact is formed.

The contact is made from a blank having the shape shown in FIG. 4. The center area 28 of the blank is subsequently bent down at its side edges to form the upwardly channelled portion 56 of the back 12. The parts 30 are convexed to form the split neck 22, and the parts 32 are convexed to form the split head 24. The button is located about midway of the channelled portion 56. The opening at 20 acts subsequently to receive the pin of the vacuum tube. The hole 34 facilitates resilient spreading of the pin grip at the slits 16 and 18, which were previously referred to. The depression or concavity at 20 facilitates entry of the tube pin from above, and helps grip it against removal.

Figure 9:
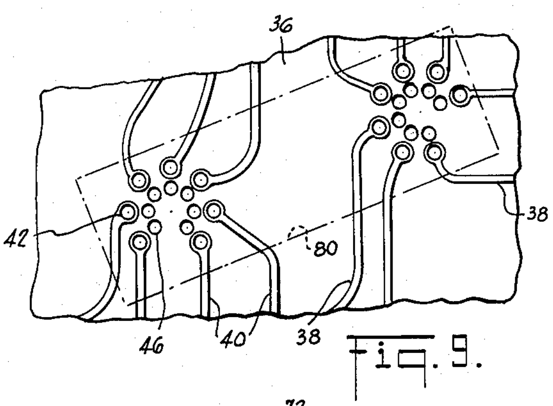
FIG. 9 is explanatory of a feature of the invention, whereby a plurality of arrays of contacts may be simultaneously applied to a printed circuit board.

Referring now to FIG. 9 of the drawing, I there show a piece of printed circuit board 36. This has printed circuitry indicated at 38 and 40, the conductors of which lead to vacuum tubes, not shown. At the location of a vacuum tube, the board is provided with a circle of holes 42, and a plurality of metal contacts are received by said holes. More specifically, the neck 22 of a contact is received in the hole, and the enlarged head 24 projects beneath the hole, and later receives solder to connect it to a printed circuit line 38. The solder may be applied by dipping or pot soldering, resulting in a circular rim of solder around the head, a section through which is shown at 44 in FIG. 6.

Figure 6:
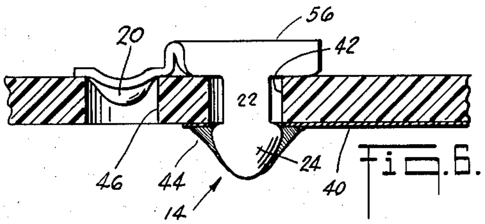
FIG. 6 is a section taken through a printed circuit board at one of the contacts mounted therein.

Reverting to FIG. 9, the printed circuit board is preferably provided with concentric circles of holes 46 and 42, and the inner holes 46 correspond to the location of the vacuum tube pins. The outer holes 42 are radially aligned with the inner holes 46. The pin grip 20 of a contact is received in the upper end of an inner hole 46, as is best shown in FIG. 6. The contact is disposed radially, and is held in that position, by the relation of the inner and outer holes 46 and 42. Because the pin grip 20 is disposed substantially higher than the enlarged head 24 of the button, the contacts may be pot soldered without putting solder on the pin grip 20.

As so far described, the set manufacturer would be burdened with the task of applying individual contacts to a printed circuit board. This would slow the manufacture of sets and increase the labor cost thereof. In accordance with a further feature of the present invention, I provide a step product or package product which comprises a piece of paper board or cardboard 50 (FIGS. 2, 3 and 5), which carries a pre-arranged array of metal contacts disposed much as they would be in a conventional vacuum tube socket, and in proper relation to receive a vacuum tube. The cardboard 50 has a ring of radially disposed, elongated slots 52, each receiving and temporarily holding one of the metal contacts. A contact is received in a slot and is held against upward movement by the enlarged head 24. It is held against downward movement by the slightly enlarged shoulders 54 which are formed between the upwardly channelled part 56 of the top 12, and the slightly concave end or pin grip portion of the top 12.

The contact is held against rotation by the fact that the pin grip and button are both received in the slot. The product 50 may be made and assembled by a socket manufacturer, and sold to the set manufacturer much as before.

Figure 7:
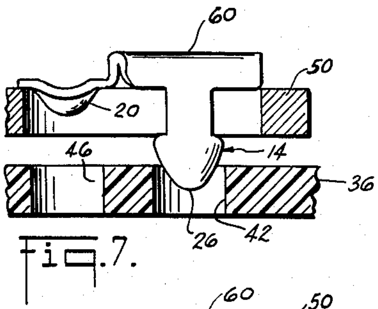
FIGS. 7 and 8 show successive stages in the transfer of an array of metal contacts from the cardboard holder to a printed circuit board.
Figure 8:
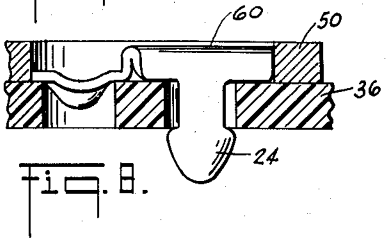

Referring now to FIGS. 7 and 8, it will be seen that the product 50 with its load of contacts 60 may be disposed over a printed circuit board 36, with the pointed ends 26 of the snap buttons 14 resting in the outer ring of holes 42 (FIG. 3). The inner ring of holes 46 is empty. A suitable punch or striking surface may then be used to press downwardly on the ring of contacts 60, thereby transferring them from the cardboard 50 to the printed circuit board 36, as shown by the change from FIG. 7 to FIG. 8 of the drawing. It will be understood that the pressure is sufficient to push the shoulders 54 through the cardboard. The contacts are pushed down far enough for the enlarged heads 24 to snap beneath the bottom surface of the printed circuit board. Thereafter the cardboard 50 may be removed, but this step may be deferred until after the pot soldering operation, if desired.

Figure 5:
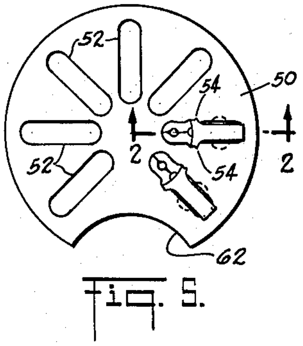
FIG. 5 is a plan view of a cardboard holder, with several contacts in position thereon.
Figure 10:
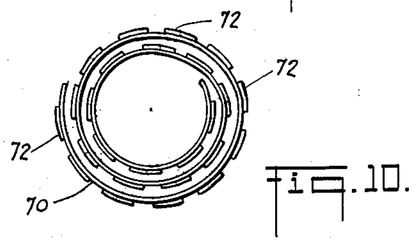
FIG. 10 is explanatory of a modification in which the step product is a continuous rolled strip.

The product may be sold in a number of different forms. Some illustrated forms are shown in FIGS. 5, 9 and 10 of the drawing. FIG. 5 illustrates a product which is generally circular except for a means 62 to fix the orientation of the array of contacts carried thereby. More specifically, in the present illustration, the contacts will receive a miniature tube having seven prongs at the spacing of eight. The piece of cardboard 50 is circular, much like a tube socket, but is recessed at 62 at the gap where there is no contact. Instead of a recess, the cardboard could be provided with a "flat," or it could be provided with a sharp notch, etc.

The set manufacturer places individual pieces in desired orientation over the printed circuit panel. Each may be pressed home individually, or several may be pressed home at once.

If desired, the cardboard may be in the form of a long strip, rolled into a roll. Such a product is illustrated in FIG. 10, in which the strip 70 is formed into a roll. This has arrays of contacts 72 disposed sequentially thereon, in spaced relation therealong. In use, short pieces of cardboard with individual assemblies may be cut from the strip, and positioned on the printed circuit board.

One of the advantages of the present invention is that a plurality of arrays of contacts may be disposed in a cardboard holder in the same relative location and orientation as is required for a particular printed circuit board. This is illustrated in a limited way in FIG. 9, in which a piece of cardboard may have the outline shown at 80, and may carry the contacts needed for the two vacuum tube locations shown, with the contacts properly oriented so that an operator need only position the cardboard 80 over both sets of holes, and then by means of hand press or foot press or the like, transfer all of the contacts simultaneously to the printed circuit board 36. It is clear that cards with contacts for more than two tubes may be provided.

It is believed that the construction and method of use of my improved contact and product, as well as the advantages thereof, will be apparent from the foregoing detailed description. The need for an insulation base is eliminated. The contacts are assembled with a printed circuit board, in a compact relation, without wasted height. The contact requires only a minimum of metal, compared to a conventional contact for a socket having long upright posts. The configuration of the resilient button is such that the solder connecting the same to a printed circuit line forms a relatively long ring of solder, thus insuring a good, low resistance connection. The contacts are handled by the set manufacturer with all of the convenience of using an assembled socket. Indeed, they may be handled even more conveniently when contacts are provided for multiple sockets and simultaneously applied to a single printed circuit board.

The contacts are received in the board with a snap engagement which is secure, and which holds the contacts firmly until completion of the pot soldering operation. The transfer of the contacts from the cardboard to the printed circuit board may be performed by a special tool having a ring of punches, but the dimensioning of the parts is preferably such that the transfer may be effectuated by a simple broad flat die surface bearing over the entire ring of contacts.

It will be understood that while I have shown and described my invention in a preferred form, changes may be made in the structure shown without departing from the scope of the invention, as sought to be defined in the following claims. In the claims, the reference to a vacuum tube is intended to apply broadly to detachable components having multiple pins affording a detachable connection. In most cases, the pins are arranged on a circle, but in some cases, they are arranged on one or more lines. The term "vacuum tube" is used in the claims merely for convenience rather than in limitation thereof. The reference to the enlarged head of the contact being pointed is intended to include round or bullet-nosed, or other such shape which facilitates insertion through a mating aperture in the printed circuit board.

I claim:

1. A package product comprising a piece of cardboard and a pre-arranged array of metal contacts for simultaneous use without the cardboard in a printed circuit board for receiving the base pins of a vacuum tube or the like in said array of contacts in lieu of a conventional socket, said cardboard being expendible and having of apertures, each temporarily receiving and frictionally holding one of said contacts, the cardboard being soft enough for the apertures to be yieldable under force, and the relation of the contacts and cardboard being such that the contacts may be simultaneously pushed down through the cardboard into mating holes in a printed circuit board in proper position to receive the aforesaid base pins.

2. A product as defined in claim 1, in which the cardboard is generally circular except for means to fix the orientation of the array of contacts carried thereby.

3. A product as defined in claim 1, in which the cardboard is a long strip of cardboard rolled into a roll, and in which the arrays of contacts are disposed sequentially thereon in spaced relation therealong.

4. A product as defined in claim 1, in which a plurality of arrays of contacts are provided on a single piece of cardboard, with said arrays being disposed in the same relative location and orientation as is required for the contacts in the particular printed circuit board with which the product is to be used, whereby a plurality of arrays may be simultaneously pushed into position in the printed circuit board.

5. A package product comprising a piece of cardboard and a pre-arranged array of metal contacts for simultaneous use without the cardboard in a printed circuit board for receiving the base pins of a vacuum tube or the like in said array of contacts in lieu of a conventional socket, said cardboard being expendible and having a ring of radially disposed elongated slots, each temporarily receiving and frictionally holding one of said metal contacts, said contacts each being made of a single piece of sheet metal shaped and formed to provide an elongated top, a split resilient snap button depending from said top near one end thereof, said top being longitudinally split to form a pin grip near the other end thereof, said pin grip being substantially higher than the snap button, the cardboard being soft enough for the apertures to be yieldable under force, and the relation of the contacts and cardboard being such that the contacts may be simultaneously pushed down through the cardboard into mating holes in a printed circuit board in proper position to receive the aforesaid base pins.

6. A product as defined in claim 5, in which the cardboard is generally circular except for a notch or means to fix the orientation of the array of contacts carried thereby.

7. A product as defined in claim 5, in which the cardboard is a long strip of cardboard rolled into a roll, and in which the arrays of contacts are disposed sequentially thereon in spaced relation therealong.

8. A product as defined in claim 5, in which a plurality of arrays of contacts are provided on a single piece of cardboard, with said arrays being disposed in the same relative location and orientation as is required for the contacts in the printed circuit board with which the product is to be used, whereby a plurality of arrays may be simultaneously pushed into position on the printed circuit board.

9. A package product comprising a piece of cardboard and a pre-arranged array of metal contacts for simultaneous use without the cardboard in a printed circuit board for receiving the base pins of a vacuum tube or the like in said array of contacts in lieu of a conventional socket, said cardboard being expendible and having a ring of radially disposed elongated slots, each temporarily receiving and frictionally holding one of said metal contacts, said contacts each being made of a single piece of sheet metal shaped and formed to provide an elongated top having small sideward enlargements or shoulders, a split resilient snap button depending from said top near one end thereof, said top being longitudinally split to form a pin grip near the other end thereof, said pin grip being substantially higher than the snap button, said button having a neck and an enlarged head, said head being somewhat pointed to facilitate insertion through a mating hole in the board, the cardboard being soft enough for the apertures to be yieldable under force, and the relation of the contacts and cardboard being such that the contacts are held by the shoulder and head but may be simultaneously pushed down through the cardboard into mating holes in a printed circuit board in proper position to receive the aforesaid base pins.

10. A product as defined in claim 9, in which the cardboard is generally circular except for a notch or means to fix the orientation of the array of contacts carried thereby.

11. A product as defined in claim 9, in which the cardboard is a long strip of cardboard rolled into a roll, and in which the arrays of contacts are disposed sequentially thereon in spaced relation therealong.

12. A product as defined in claim 9, in which a plurality of arrays of contacts are provided on a single piece of cardboard, with said arrays being disposed in the same relative location and orientation as is required for the contacts in the printed circuit board with which the product is to be used, whereby a plurality of arrays may be simultaneously pushed into position on the printed circuit board.

References Cited in the file of this patent

UNITED STATES PATENTS

| | | |
|---|---|---|
| 1,854,203 | Kroger | Apr. 19, 1932 |
| 1,884,445 | Wever | Oct. 25, 1932 |
| 2,273,099 | Gilbert | Feb. 17, 1942 |
| 2,521,186 | Pennella | Sept. 5, 1950 |
| 2,745,081 | Offerman | May 8, 1956 |
| 2,747,169 | Johanson | May 22, 1956 |
| 2,815,124 | Pellier | Dec. 3, 1957 |
| 2,830,698 | Coda | Apr. 15, 1958 |
| 2,881,911 | Krill | Apr. 14, 1959 |
| 2,917,723 | Gluck | Dec. 15, 1959 |
| 2,937,358 | Bulger | May 17, 1960 |

OTHER REFERENCES

Electronic Industries and Tele-Tech (publication), October 1956, pages 62, 63 and 158 through 162.